(12) United States Patent
Yoshida et al.

(10) Patent No.: US 11,398,386 B2
(45) Date of Patent: Jul. 26, 2022

(54) PLASMA ETCH PROCESSES

(71) Applicant: Tokyo Electron Limited, Tokyo (JP)

(72) Inventors: Yusuke Yoshida, Albany, NY (US); Sergey Voronin, Albany, NY (US); Shyam Sridhar, Albany, NY (US); Caitlin Philippi, Albany, NY (US); Christopher Talone, Albany, NY (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 9 days.

(21) Appl. No.: 16/793,231

(22) Filed: Feb. 18, 2020

(65) Prior Publication Data

US 2020/0273711 A1 Aug. 27, 2020

Related U.S. Application Data

(60) Provisional application No. 62/809,041, filed on Feb. 22, 2019.

(51) Int. Cl.
*H01L 21/3065* (2006.01)
*H01L 21/311* (2006.01)
*H01L 21/3213* (2006.01)
*H01L 21/67* (2006.01)

(52) U.S. Cl.
CPC .... *H01L 21/3065* (2013.01); *H01L 21/31111* (2013.01); *H01L 21/32137* (2013.01); *H01L 21/32139* (2013.01); *H01L 21/67063* (2013.01)

(58) Field of Classification Search
None
See application file for complete search history.

(56) References Cited

U.S. PATENT DOCUMENTS

| | | | |
|---|---|---|---|
| 6,699,399 B1 * | 3/2004 | Qian | H01L 21/02071 216/67 |
| 7,368,394 B2 * | 5/2008 | Shen | H01L 21/32137 216/76 |
| 9,595,451 B1 * | 3/2017 | Zhou | H01L 21/31116 |
| 2002/0132422 A1 * | 9/2002 | Ranade | H01L 21/3065 438/386 |

* cited by examiner

*Primary Examiner* — Stephanie P Duclair
(74) *Attorney, Agent, or Firm* — Slater Matsil, LLP

(57) ABSTRACT

In one example, a method of processing a substrate includes receiving a substrate in a processing chamber, the substrate having an etch mask positioned over an underlying layer to be etched, where the underlying layer is a silicon-containing layer. The method includes executing a first etch process that includes forming a first plasma from a first process gas that includes hydrogen bromide or chlorine and etching the underlying layer using products of the first plasma. The method includes executing a second etch process that includes forming a second plasma from a second process gas that includes fluorine and etching the substrate using products from the second plasma. The method may include alternating between the first etch process and the second etch process.

20 Claims, 3 Drawing Sheets

PLASMA ETCH PROCESSES

CROSS-REFERENCE TO RELATED APPLICATIONS

This application claims the benefit of U.S. Provisional Application No. 62/809,041, filed on Feb. 22, 2019, which application is hereby incorporated herein by reference.

TECHNICAL FIELD

The present invention relates generally to fabrication, and, in particular embodiments, to plasma etch processes.

BACKGROUND

Advancements in semiconductor integrated circuits (IC's) are driven by a demand for higher functionality at reduced cost, generally provided by increasing the packing density of components. An IC is a network of electronic components (e.g., transistor, resistor, and capacitor) interconnected by a multilevel system of conductive lines, contacts, and vias. Elements of the network are integrated together by sequentially depositing and patterning layers of dielectric, conductive, and semiconductor materials over a semiconductor substrate using a fabrication flow comprising process steps such as chemical vapor deposition (CVD), photolithography, and etch. The packing density of circuit elements have been increased by periodically reducing minimum feature sizes with innovations such as immersion lithography and multiple patterning, as well as with three-dimensional (3D) device structures (e.g., FinFET and stacked capacitor memory cell) to achieve reduction in device footprint.

Plasma processes such as reactive ion etching (RIE), plasma-enhanced CVD (PECVD), plasma-enhanced atomic layer etch and deposition (PEALE and PEALD), and cyclic plasma process (e.g., cycles of alternating deposition and etch) are routinely used in the deposition and patterning steps used in semiconductor IC fabrication. The challenge of providing manufacturable plasma technology for advanced IC designs, however, has intensified with the advent of feature sizes scaled down to a few nanometers with structural features controlled at atomic scale dimensions. Manufacturable plasma processes are expected to provide structures with precise dimensions and precisely controlled features. For example, a plasma etch process may have to meet precise specifications on linewidth, space, etch depth, etch profile (e.g., sidewall angle), and etch selectivity to masking layers and etch-stop layers. Uniformity of structural dimensions and features across a wide (e.g., 300 mm) wafer may have to be maintained for high manufacturing yield. Thus, innovations in plasma process technology and methods may be needed for production of advanced IC designs.

SUMMARY

In accordance with an embodiment of the present invention, a method of processing a substrate includes receiving a substrate in a processing chamber, the substrate having an etch mask positioned over an underlying layer to be etched, where the underlying layer is a silicon-containing layer. The method includes executing a first etch process that includes forming a first plasma from a first process gas that includes hydrogen bromide or chlorine and etching the underlying layer using products of the first plasma. The method includes executing a second etch process that includes forming a second plasma from a second process gas that includes fluorine and etching the substrate using products from the second plasma. The method may include alternating between the first etch process and the second etch process.

A method of processing a substrate includes receiving a substrate in a processing chamber, the substrate including a patterned layer disposed over a layer to be patterned, where the layer to be patterned includes silicon. The method includes forming recesses in the layer to be patterned to a first depth with a first plasma etch process using a first process gas including a first halogen element. The method includes extending the recesses to a second depth by using a second plasma etch process using a second process gas including a second halogen element, where the second halogen element is more electronegative than the first halogen element, where the first plasma etch is more selective than the second plasma etch process.

A method of processing a substrate includes receiving a substrate in a processing chamber, the substrate including a patterned layer disposed over a layer to be patterned, where the layer to be patterned includes silicon. The method includes using the patterned layer as an etch mask, performing a first etch process on the substrate in the processing chamber, where the first etch process forms recesses in the layer to be patterned and byproducts covering top surfaces of the patterned layer. The method includes performing a second etch process on the substrate in the processing chamber, where the second etch process extends the recesses into the layer to be patterned and etches a portion of the byproducts.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-3 illustrate cross-sectional views of a semiconductor device at various stages of an example sequence of process steps used to etch trenches in a semiconductor substrate, in accordance with an embodiment of the invention, wherein FIG. 1 illustrates a cross-sectional view of a substrate with an etch target layer to be patterned and a patterned layer formed over the substrate, wherein FIG. 2A illustrates a cross-sectional view of the substrate after a selective plasma etch step of a multi-step cyclic etch process, wherein FIG. 2B illustrates a cross-sectional view of the substrate after a lean plasma etch step of a multi-step cyclic etch process, and wherein FIG. 3 illustrates a cross-sectional of view the substrate at the end of the multi-step cyclic etch process;

DETAILED DESCRIPTION OF ILLUSTRATIVE EMBODIMENTS

Figure 1:
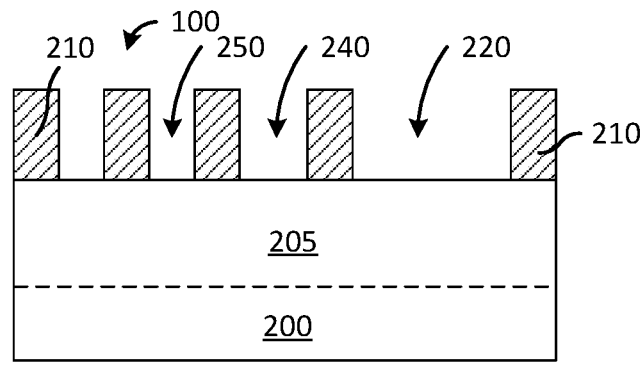

This disclosure describes embodiments of patterned plasma etch processes, wherein a multi-step cyclic plasma etch technique is used to provide improved etch selectivity for anisotropic plasma etch processes with improved uniformity in etch profile and etch depth over a wider range of dimensions of the mask pattern. A mask material over a portion of the top surface of the target material is used to protect the covered region of the surface from exposure to etchants. Openings in the patterned masking layer expose the remaining surface to etchants introduced into a plasma processing chamber. Openings are cavities formed in the space between features (e.g., lines) in the patterned masking layer and may be of various shapes and dimensions (e.g., a long and narrow rectangular trench, or a square or circular hole). Example embodiments of the multi-step cyclic plasma etch process as applied to reactive ion etching (RIE) of silicon using a patterned dielectric mask (e.g., a patterned silicon oxide mask) has been described to illustrate the technique. Application of the multi-step cyclic plasma etch technique to other materials is also discussed.

Each cycle of the multi-step cyclic plasma etch comprises at least two plasma etch steps performed sequentially.

The first step, referred to as the selective plasma etch, utilizes a gas mixture, whereby the etching process removes target material selective to the mask material. The selective plasma etch step helps provide a desired etch selectivity to the patterned mask material. Here, removal of the target material "selective" to the patterned mask material implies that the removal rate for the target material is higher than the removal rate for the patterned mask material, and "etch selectivity" refers to a ratio of the removal rate of the target material to the removal rate of the patterned mask material.

During the selective plasma etch there may be solid by-products that deposit near the top of openings, thereby reducing the width of the opening at the top. In an anisotropic RIE plasma process, the removal rate at the bottom surface may depend on the width of the opening at the top. Generally, the removal rate of target material from the bottom wall of a cavity may reduce with decreasing width at the top of the opening. The bottom wall removal rate may drop further as the etch progresses and the bottom surface is recessed deeper. The sidewall angle may also deviate from the desired near-vertical angle.

The second step, referred to as the lean plasma etch, reduces this effect by using a gas mixture that removes some of the solid by-products from the selective plasma etch and etches the target material. The process parameters of the lean plasma etch may be adjusted to provide a desired roughly constant removal rate and a desired near-vertical sidewall angle. However, the lean plasma etch may have a relatively poor selectivity to the patterned mask material, relative to the selective plasma etch.

By alternately performing the selective plasma etch and lean plasma etch, the multi-step cyclic plasma etch helps provide improved uniformity in etch selectivity and in etch characteristics such as sidewall angle and etch depth. Tighter variation may be provided from edge to center across a wafer as well as over a wider range of widths of the etched openings.

Any number of cycles of the multi-step cyclic plasma etch process may be performed depending on the desired etch depth and the amount of target material removed in each cycle. A programmable controller may terminate the cycling loop after a fixed number of cycles specified in the process recipe or by using an end-point detection system. The etch selectivity of the selective plasma etch step combined with the roughly constant removal rate and near-vertical sidewall angle of the lean plasma etch step allow the patterned multi-step cyclic plasma etch to achieve the desirable characteristics of etch selectivity along with uniformity of etch profile and etch depth. All the process steps of the multi-step cyclic plasma etch process may be performed consecutively after loading the semiconductor wafer (or wafers) in a plasma processing chamber without unloading the wafer (or wafers) between successive process steps. Example embodiments are described in further detail below.

An example embodiment of the multi-step cyclic plasma etch process used to etch trenches in a silicon substrate is described with reference to cross-sectional views of a semiconductor wafer illustrated in FIGS. 1-3. The processing flow in the example embodiment (illustrated in FIGS. 1-3) has been described in the context of a more general multi-step cyclic plasma etch process flow 400 illustrated by a flow diagram in FIG. 4. The processing details refer to an example plasma processing system 500 illustrated schematically in FIG. 5.

Figure 2A:
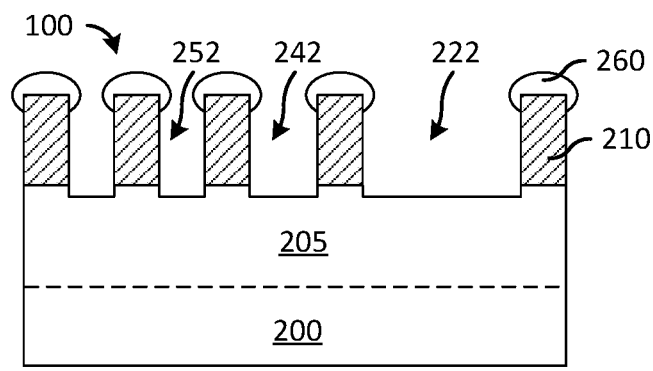
Figure 2B:
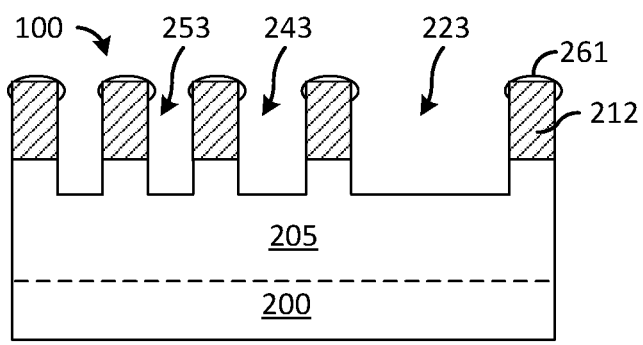
Figure 3:
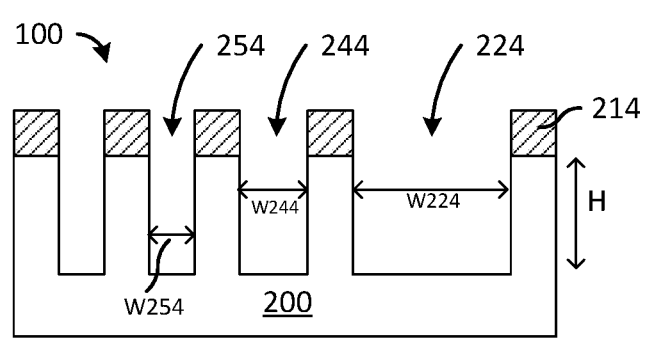

In the example etch process illustrated in FIGS. 1-3, it may be desired to recess the exposed silicon to a predetermined depth with a near-vertical sidewall profile. FIG. 1 illustrates a cross-sectional view of an incoming semiconductor wafer 100. The example incoming semiconductor wafer 100 comprises a substrate 200 with an etch target layer 205 to be patterned and a patterned layer 210 formed over the substrate 200. In one exemplary embodiment, the etch target layer 205 and substrate 200 comprise a silicon substrate or silicon-on-insulator (SOI) substrate. So, a surface of silicon may be exposed between features of the patterned layer 210. In further embodiments, the substrate 200 comprises a layer of silicon, a layer of silicon germanium, or a layer of compound semiconductor such as InP.

Similarly, in one exemplary embodiment, the patterned layer 210 may comprise a silicon oxide layer. In additional embodiments, the patterned layer 210 comprises silicon nitride, silicon-containing anti-reflective coating, or an organic material.

In this example, the etch target layer 205 comprising, for example, silicon is the etch target for the multi-step cyclic plasma etch process, and the patterned layer 210 is the etch mask.

The thickness of patterned layer 210 used may depend on the etch selectivity of the subsequent etches where the patterned layer 210 is used as a hard mask. A high selectivity may be desirable because it allows the thickness of the patterned layer 210 to be reduced, which helps reduce the aspect ratio, which facilitates etchant gases enter narrow openings. For example, the thickness of the patterned layer 210 in FIG. 1 may be about 10 nm-500 nm to be used as hard mask for a desired silicon recess of about 20 nm-1000 nm.

The patterned layer 210 may be formed during earlier processing by using a suitable deposition technique such as low-pressure CVD (LPCVD), or high-density plasma CVD (HDP-CVD), or thermal oxidation of silicon, or the like, or a combination thereof, and patterned using suitable photolithography (e.g., deep ultra-violet (DUV) lithography) and etching techniques. As one example, anisotropic reactive ion etching (RIE) of silicon oxide with a patterned photoresist mask may be performed with plasma using a gas mixture comprising process gases such as $CF_4/H_2$, or $CHF_3/O_2$, or $C_2F_6$, as known to a person having ordinary skill in the art.

Openings of various widths extending through the patterned layer 210 may expose a portion of the top surface of the etch target layer 205. For example, as illustrated in FIG. 1, opening 220 is wider than openings 240 and 250, and opening 250 is narrower than opening 240.

Figure 4:
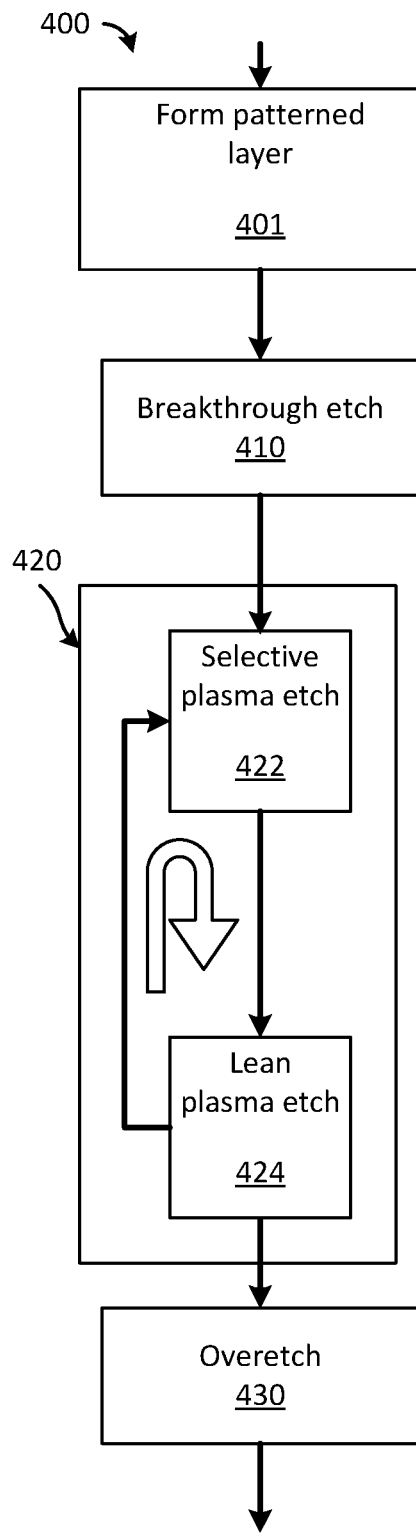
FIG. 4 is a flow diagram of a multi-step cyclic plasma etch technique, in accordance with an embodiment of the invention.

The processing steps used to form a patterned masking layer, such as the patterned layer 210 in FIG. 1, is indicated by the box 401 of the process flow 400 illustrated in the flow diagram in FIG. 4. The incoming semiconductor wafer, such as the incoming semiconductor wafer 100 in FIG. 1, is then loaded into a plasma processing chamber, for example, the plasma processing chamber 510 of the example plasma processing system 500, illustrated schematically in FIG. 5.

Figure 5:
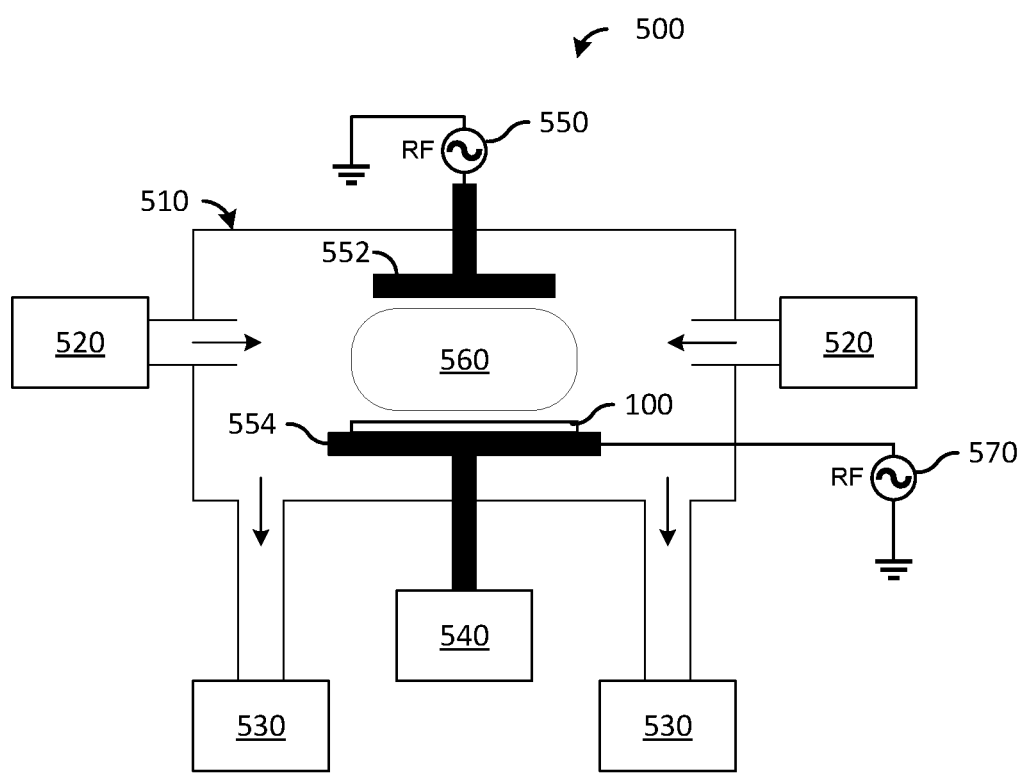
FIG. 5 illustrates a general schematic of a plasma processing system in accordance with an embodiment of the invention.

For illustrative purposes, FIG. 5 illustrates a semiconductor wafer 100 placed on a substrate holder 554 (e.g., a circular electrostatic chuck (ESC)) inside the plasma processing chamber 510 near the bottom. The semiconductor wafer 100 may be maintained at a desired temperature using a temperature controller 540 connected to the substrate holder 554. The ESC may be coated with a conductive material (e.g., a carbon-based or metal-nitride based coating) so that electrical connections may be made to the substrate holder 554.

As illustrated schematically in FIG. 5, the substrate holder 554 may be a bottom electrode of the plasma processing chamber 510. In the illustrative example in FIG. 5, the substrate holder 554 is connected to an RF-bias power source 570. A conductive circular plate inside the plasma processing chamber 510 near the top is the top electrode 552. In FIG. 5, the top electrode 552 is connected to an RF power source 550 of the example plasma processing system 500. In some other embodiment, the top electrode may be a conductive coil located outside the plasma processing chamber 510 over a top ceramic window.

The first etch step after loading the incoming semiconductor wafer 100 in the plasma processing chamber 510 may be an in situ breakthrough etch step 410 indicated in FIG. 4. The breakthrough etch step 410 may be used to remove any contaminants or native oxide that may be present over the top surface to condition the surface prior to subsequent etching. For the example incoming semiconductor wafer 100, the breakthrough etch step 410 may be a sputter etch using, for example, argon ions as the sputtering agent, or a chemical plasma etch using, for example, chlorine ($Cl_2$), or boron trichloride ($BCl_3$), or a fluorocarbon precursor like $CF_4$, or a combination thereof, or the like. In one embodiment, the breakthrough etch step 410 may use plasma generated from a gaseous mixture comprising process gases chlorine ($Cl_2$) and argon (Ar). The gases may be introduced into the plasma processing chamber 510 by a gas delivery system 520, as illustrated schematically in FIG. 5.

The gas delivery system 520 comprises gas flow controllers to control the flow of chemicals into the chamber. In some embodiments, optional center/edge splitters may be used to independently adjust the gas flow rates at the center and edge of the incoming semiconductor wafer 100.

In one or more embodiments with optional center/edge gas flow splitters, a center to edge gas flow rate of $Cl_2$ may vary between 1:0.2 to 1:5, and in one embodiment between 1:1 to 1:1.5. In one or more embodiments, the center flow rate of $Cl_2$ may vary between 20 sccm to 200 sccm, and in one embodiment between 40 sccm to 80 sccm. In one or more embodiments, the edge flow rate of $Cl_2$ may vary between 20 sccm to 200 sccm, and in one embodiment between 60 sccm to 120 sccm. In one embodiment, a center to edge gas flow rate of argon may vary between 1:0.2 to 1:5, and in one embodiment between 1:1 to 1:1.5. In one or more embodiments, the center flow rate of argon may vary between 20 sccm to 200 sccm, and in one embodiment between 40 sccm to 180 sccm. In one or more embodiments, the edge flow rate of argon may vary between 40 sccm to 400 sccm, and in one embodiment between 80 sccm to 150 sccm. A low process pressure may be maintained by a vacuum exhaust system 530, shown schematically in FIG. 5. In one embodiment, a low process pressure between about 1 mT to about 500 mT may be maintained in the plasma processing chamber 510, and in one embodiment between 10 mT and 20 mT.

The ESC temperature may be adjusted by the temperature controller 540 to heat/cool the substrate holder 554 to a desired temperature. In one or more embodiments, the desired temperature of the substrate holder 554 may be about −10° C. to 100° C., and about 30° C. to 40° C. in one embodiment. The RF-bias power source 570 may be used to supply about 20 W to 1000 W of continuous wave (CW) or pulsed RF power at a frequency of about 0.4 MHz to 27.12 MHz to sustain the plasma, such as plasma 560 in the schematic illustrated in FIG. 5. The pulse modulation frequency may be from about 2 Hz to about 1 kHz and duty cycle may be from about 1% to 100%, where 100% implies CW RF power.

Plasma 560, shown between the top electrode 552 and the bottom electrode (also the substrate holder 554), exemplifies direct plasma generated close to the semiconductor wafer 100 in the plasma processing chamber 510 of the example plasma processing system 500. After the surface conditioning is completed the plasma processing chamber may be prepared to perform the first step of the multi-step cyclic etch process on the cleaned semiconductor wafer 100.

In the process flow 400 in FIG. 4, one cycle of the multi-step cyclic etch process 420 comprises two successive etch steps, a first etch process (labeled selective plasma etch step 422) and a second etch process (labeled as lean plasma etch step 424). The selective plasma etch step 422 and the lean plasma etch step 424 may both use etchants that remove the target material, as explained above.

In one embodiment, while both the selective plasma etch step 422 and the lean plasma etch step 424 use halogen based chemistries, the selective plasma etch step 422 may use a less electronegative halogen than the lean plasma etch step 424. Partly because of this, the selective plasma etch step 422 may be more selective than the lean plasma etch step 424. The curved arrow in FIG. 4 indicates that the multi-step cyclic etch process 420 may loop through one or more cycles. In some embodiments (e.g., in the process illustrated in FIGS. 1-3), a fixed number of cycles may be specified in the process recipe while, in other embodiments, the number of cycles may be determined using an end-point detection system. An optional overetch step 430 (shown in the flow-diagram in FIG. 4) may be performed after completing the loop through the multi-step cyclic etch process 420. Once the plasma processing chamber 510 is loaded to perform the breakthrough etch step 410, all the processing steps in the process flow 400 may be performed in situ, including the optional overetch step 430.

Although a two-step cycle is used for the multi-step cyclic etch process 420, it is understood that one cycle may comprise more than two successive etch steps. For example, an etch process that removes solid by-products formed during the selective plasma etch step 422 but is selective to the target material may be inserted between the selective plasma etch step 422 and the lean plasma etch step 424.

FIG. 2A illustrates a cross-sectional view of the semiconductor wafer 100 after the selective plasma etch step 422 of the multi-step cyclic etch process 420. In FIG. 2A, the surface at the bottom of the openings (e.g., openings 222, 242, and 252) is recessed relative to the surface of the incoming semiconductor wafer 100 in FIG. 1 (e.g., openings 220, 240, and 250).

The selective plasma etch step 422 in this example may be an RIE using a hydrogen bromide (HBr) based plasma to etch silicon with an etch selectivity of about 5 to 200 with respect to silicon oxide. The etch selectivity and the silicon removal rate generally depend on the plasma parameters. In one embodiment, the selective plasma etch step 422 may use plasma generated from a gaseous mixture comprising process gases hydrogen bromide (HBr) and oxygen ($O_2$) and a carrier gas comprising Ar. The gas flow rates at the center/edge of the semiconductor wafer 100 may be adjusted based on the features being formed.

In one or more embodiments with optional center/edge gas flow splitters, a center to edge gas flow rate of HBr may vary between 1:1 to 1:10, and in one embodiment between 1:2 to 1:5. In one or more embodiments, the center flow rate of HBr may vary between 100 sccm to 1000 sccm, and in one embodiment between 200 sccm to 300 sccm. In one or more embodiments, the edge flow rate of HBr may vary between 500 sccm to 2000 sccm, and in one embodiment between 800 sccm to 1200 sccm.

In one or more embodiments with optional center/edge gas flow splitters, a center to edge gas flow rate of oxygen may vary between 1:1 to 1:10, and in one embodiment between 1:2 to 1:5. In one or more embodiments, the center flow rate of oxygen may vary between 1 sccm to 100 sccm, and in one embodiment between 1 sccm to 10 sccm. In one or more embodiments, the edge flow rate of oxygen may vary between 10 sccm to 200 sccm, and in one embodiment between 10 sccm to 20 sccm.

In one or more embodiments with optional center/edge gas flow splitters, a center to edge gas flow rate of argon may vary between 1:1 to 1:10, and in one embodiment between 1:2 to 1:5. In one or more embodiments, the center flow rate of argon may vary between 100 sccm to 1000 sccm, and in one embodiment between 100 sccm to 300 sccm. In one or more embodiments, the edge flow rate of argon may vary between 500 sccm to 2000 sccm, and in one embodiment between 500 sccm to 1000 sccm.

A low process pressure may be maintained by a vacuum exhaust system 530, shown schematically in FIG. 5. In one embodiment, a low process pressure between about 10 mT to about 500 mT may be maintained in the plasma processing chamber 510, and in one embodiment between 100 mT and 200 mT.

The ESC temperature may be adjusted by the temperature controller 540 to heat/cool the substrate holder 554 to a desired temperature. In one or more embodiments, the desired temperature of the substrate holder 554 may be about −10° C. to 100° C., and about 30° C. to 40° C. in one embodiment.

The plasma may be sustained by RF or microwave (MW) power source 550 of about 1000 W to 2000 W of continuous wave (CW) RF power at a frequency of about 2 MHz to 2.45 GHz. The RF-bias power source 570 may be used to additionally supply about 200 W to 500 W of continuous wave (CW) or pulsed RF power at a frequency of about 0.4 MHz to about 27.12 MHz to sustain the plasma, such as plasma 560 in the schematic illustrated in FIG. 5.

The high selectivity of the selective plasma etch step 422 used in the example embodiment described above with reference to FIG. 2A may be partially attributed to etch byproducts that have a low volatility, for example, $SiBr_xO_y$ complexes. Some of the low volatile byproducts may get deposited as solid material. This deposition may occur over the entire surface, but it accumulates mainly on or close to the top surface of the patterned layer 210, as illustrated in FIG. 2A by the mushroom-shaped deposits 260. This provides the advantage of high selectivity by protecting the patterned layer 210. Even a small amount of the low volatile products that may deposit on the silicon sidewalls deeper in the opening may enhance the etch anisotropy by reducing the removal rate of silicon from the sidewalls of the openings. However, excessive growth of the mushroom-shaped deposits 260 may have the undesired effect of restricting the gaseous etch reactants from reaching the silicon surface at the bottom of the openings, such as the openings 252, 242, and 222. The etch time for the selective plasma etch step 422 may be adjusted to limit the lateral extent of the mushroom-shaped deposits 260 so as to avoid throttling the gas flow to the openings 252, 242, and 222.

If the mushroom-shaped deposits 260 were allowed to extend further, then the top of the narrower openings may get clogged. This would affect the etch characteristics as the etching ions and radicals get deflected by the mushroom-shaped deposits 260, thereby causing a depletion of etchants inside the cavity of the openings. Deflection of ions also alters the angle distribution of the etchants to being less directional, thereby affecting the sidewall angle. The depletion and loss of directionality of etchants is more severe in narrower openings because a larger fraction of the top dimension is blocked relative to a wider opening. For example, the silicon removal rate at the bottom surface in opening 252 may be lower than that in opening 242, and the silicon removal rate at the bottom surface in opening 242 may be lower than that in opening 222. The sidewalls in narrow openings may be less vertical relative to sidewalls in wide openings.

In the example embodiment described above, a hydrogen bromide based etch chemistry is used to etch the semiconductor wafer 100 surface. Other embodiments may use alternate chemistry. For example, chlorine (e.g., $Cl_2$ or chlorine compounds) may be used instead of HBr. In an embodiment using chlorine, $SiCl_xO_y$ deposits may protect the respective hard mask (e.g., a silicon oxide hard mask).

After the selective plasma etch step 422 of the first cycle of the multi-step cyclic etch process 420 is completed, the gas mixture and other process parameters that affect the environment inside the plasma processing chamber 510 may be adjusted (e.g., purged in one embodiment) to perform the lean plasma etch step 424 of the first cycle.

In FIG. 2B, the semiconductor wafer 100 undergoes the lean plasma etch step 424 in the same plasma processing chamber 510. The silicon surface at the bottom of the openings 223, 243, and 253, illustrated in FIG. 2B is recessed further relative to the silicon surface of the semiconductor wafer 100 in FIG. 2A (e.g., openings 222, 242, and 252). The lean plasma etch step 424 may use a fluorine-based chemistry which also etches mushroom-shaped deposits 260, e.g., $SiBr_xO_y$. During the lean plasma etch step 424, most of the mushroom-shaped deposits 260 (shown in FIG. 2A) gets removed, leaving behind a thin protective layer 261 e.g., comprising $SiBr_xO_y$, as illustrated in FIG. 2B.

In the example illustrated in FIG. 2B, the lean plasma etch step 424 may be an RIE using plasma generated from a gaseous mixture comprising process gases $C_4F_8$ and HBr. In various embodiments used in the lean plasma etch step 424, the gaseous mixture may also include bromine or chlorine in addition to the fluorine.

In one or more embodiments with optional center/edge gas flow splitters, a center to edge gas flow rate of $C_4F_8$ may vary between 1:1 to 1:10, and in one embodiment between 1:1 to 1:3. In one or more embodiments, the center flow rate of $C_4F_8$ may vary between 1 sccm to 200 sccm, and in one embodiment between 1 sccm to 10 sccm. In one or more embodiments, the edge flow rate of $C_4F_8$ may vary between 10 sccm to 100 sccm, and in one embodiment between 10 sccm to 30 sccm.

In one or more embodiments with optional center/edge gas flow splitters, a center to edge gas flow rate of HBr may vary between 1:1 to 1:10, and in one embodiment between 1:2 to 1:5. In one or more embodiments, the center flow rate of HBr may vary between 50 sccm to 500 sccm, and in one embodiment between 100 sccm to 300 sccm. In one or more embodiments, the edge flow rate of HBr may vary between 200 sccm to 2000 sccm, and in one embodiment between 600 sccm to 1000 sccm.

In one or more embodiments with optional center/edge gas flow splitters, a center to edge gas flow rate of argon may vary between 1:1 to 1:10, and in one embodiment between 1:3 to 1:6. In one or more embodiments, the center flow rate of argon may vary between 10 sccm to 100 sccm, and in one embodiment between 30 sccm to 60 sccm. In one or more embodiments, the edge flow rate of argon may vary between 100 sccm to 1000 sccm, and in one embodiment between 200 sccm to 300 sccm.

The process pressure in the plasma processing chamber 510 may be reduced compared to the selective plasma etch step 422 discuss above. A low process pressure may be maintained by a vacuum exhaust system 530, shown schematically in FIG. 5. In one embodiment, a low process pressure between about 10 mT to about 150 mT may be maintained in the plasma processing chamber 510, and in one embodiment between 20 mT and 50 mT.

The ESC temperature may be adjusted by the temperature controller 540 to heat/cool the substrate holder 554 to a desired temperature. In one or more embodiments, the desired temperature of the substrate holder 554 may be about −10° C. to 100° C., and about 30° C. to 40° C. in one embodiment.

The plasma may be sustained using only an RF-bias power source 570. The RF-bias power source 570 may supply about 100 W to 200 W of continuous wave (CW) RF power at a frequency of about 0.4 MHz to 27.12 MHz to sustain the plasma, such as plasma 560 in the schematic illustrated in FIG. 5.

In the example embodiment described above, $C_4F_8$ has been used as the source for fluorine. Other embodiments may use some other gaseous fluorine compound such as $CF_4$, $C_4F_6$, $CH_3F$, $CHF_3$, $CH_2F_2$, $NF_3$, and/or $SF_6$.

The by-products of the lean plasma etch step 424 may be highly volatile, leaving almost no solid residue to obstruct or deflect etchant ions and radicals. With most of the remaining mushroom-shaped deposits 260 also removed by the etchants used in the lean plasma etch step 424, the silicon recess may progress to an increased depth with the desired near-vertical sidewall etch profile. However, the reduced protection due to loss of mushroom-shaped deposits 260 may lead to some loss of patterned layer 210. Accordingly, the thickness of the remaining patterned layer 212, illustrated in FIG. 2B, may be less than the thickness of the patterned layer 210 in FIGS. 1 and 2A. Once the protective layer 261 of remaining mushroom-shaped deposits 260 is completely removed, the removal rate of patterned layer 210 may rise sharply, thereby compromising the control over the thickness of the etch mask. The etch selectivity would then drop precipitously beyond a threshold etching time. The duration of the lean plasma etch step 424 in one cycle may be kept below this threshold in order to maintain control over the mask loss of the process. The constraints on the durations of the selective plasma etch step 422 and the lean plasma etch step 424 may not allow sufficient silicon to be removed to achieve the desired etch depth in one cycle. Several etch cycles comprising alternating selective plasma etch step 422 and lean plasma etch step 424 may need to be performed.

FIG. 3 illustrates a cross-sectional of view the semiconductor wafer 100 at the end of the multi-step cyclic etch process 420. In one embodiment, the thickness of the masking layer 214 remaining from the patterned layer 210 may be about 70% of the thickness of the patterned layer 210 at the beginning of the multi-step cyclic etch process 420. About 30% of the patterned layer 210 may have been lost during the etch processes. The overall selectivity of the multi-step cyclic etch process 420 may be significantly higher than what would be achieved by using a single lean etch process to obtain the target depth of the silicon recess. The reduced mask loss provides the benefit of improved thickness uniformity of the patterned layer 210 across the semiconductor wafer 100 from the wafer center to wafer edge.

As illustrated in FIG. 3, the silicon surface has been recessed to a desired depth H, thereby removing the etch target layer 205. In the example embodiment, the surface of the semiconductor wafer 100 has been selectively recessed with near-vertical sidewalls uniformly across openings with various widths (e.g., openings 224, 244, and 254 in FIG. 3). Accordingly, by combining the selective plasma etch step 422 and lean plasma etch step 424, the multi-step cyclic etch process 420 provides the advantages provided by both the steps.

In the illustrations, the first opening 224 has a depth H and a first width W224, where a ratio of the depth H to the first width W224 is about 1:1. The second opening 244 has a depth H and a second width W244, where a ratio of the depth H to the second width W244 is about 4:1. The third opening 254 has a depth H and a third width W254, where a ratio of the depth H to the third width W254 is about 8:1. Thus, embodiments of the invention enable forming openings having a large variation in aspect ratios, for example, from 1:2 to 10:1. Although FIG. 3 illustrates an ideal result, wherein all the openings (e.g., openings 224, 244, and 254) to have equal depth, H, it is understood that some variation in depth would be present during manufacturing.

In the example embodiment described above with reference to the multi-step cyclic plasma etch process flow 400 (shown in FIG. 4) and the cross-sectional views in FIGS. 2A and 2B, the more electronegative halogen, e.g., fluorine, was absent (or was of negligibly low concentration) during the selective plasma etch step 422 and the less electronegative halogen, e.g., bromine, was used as a reactant. During the lean plasma etch step 424, the more electronegative halogen e.g., fluorine, was introduced into the chamber for use as a reactant. However, the less electronegative halogen, e.g., bromine, was not absent from the gaseous mixture of the plasma: The concentration of the less electronegative halogen, e.g., bromine, was reduced (relative to the concentration used during the selective plasma etch step 422) by adjusting the plasma processing parameters (e.g., the gas flows for HBr) of the lean plasma etch step 424.

It is understood that, in various embodiments, the more electronegative halogen, e.g., fluorine, may not be substantially absent during the selective plasma etch step 422. A lower concentration of the more electronegative halogen e.g., fluorine, (relative to the concentration used during the lean plasma etch step 424) may be present along with (or instead of) the less electronegative halogen, e.g., bromine. For example, in one embodiment, the selective plasma etch step 422 comprises $CF_4$, $C_4F_8$, $C_4F_6$, $CH_3F$, $CHF_3$, or $CH_2F_2$. The plasma processing parameters (e.g., the gas flows of the reactive gases (e.g., HBr, $Cl_2$, $CF_4$, $C_4F_8$, $C_4F_6$, $CH_3F$, $CHF_3$, or $CH_2F_2$), oxygen flow rates, plasma operating conditions) of the selective plasma etch step 422 may be adjusted such that there may be a net deposition of solid by-products to protect the etch mask, for example, the mushroom-shaped deposits 260 that protect the patterned layer 210, as illustrated in FIG. 2A. Likewise, during the lean plasma etch step 424, the plasma processing parameters may be adjusted such that there may be a net removal of the solid byproducts. For example, the mushroom-shaped deposits 260 in FIG. 2A may be removed during the lean plasma etch 424, leaving only a thin protective layer 261, as illustrated in FIG. 2B.

In some embodiments, an optional overetch step 430 may be performed. Further processing of the wafer may follow conventional processing and therefore not further discussed.

The example embodiment, described above with reference to FIGS. 1-3, illustrates the advantages provided by the multi-step cyclic etch technique in etching recesses in silicon using a patterned silicon oxide hard mask. The multi-step cyclic etch technique may be applied to etch silicon using a silicon oxide hard mask to form other structures, or etch some other material using some other masking material. For example, a person skilled in the art may adapt the example embodiment of the multi-step cyclic etch technique to form sacrificial gate structures comprising amorphous silicon or polycrystalline silicon in a replacement gate complementary metal oxide semiconductor (CMOS) fabrication process flow. Yet another example where the multi-step cyclic etch technique may be applied is in etching trenches or holes in silicon oxide using patterned silicon nitride as the hard mask material. In this case, carbon-fluorine chemistry may be used with different carbon to fluorine ratios controlled by adding different amount of oxygen to the gas mixture from which the plasmas are generated. For example, the selective plasma etch step 422 may use a high C:F ratio by using a relatively small amount of oxygen, and the lean plasma etch step 424 may use a low C:F ratio by using a relatively large amount of oxygen.

Example embodiments of the invention are summarized here. Other embodiments can also be understood from the entirety of the specification as well as the claims filed herein.

Example 1

A method of processing a substrate includes receiving a substrate in a processing chamber, the substrate having an etch mask positioned over an underlying layer to be etched, where the underlying layer is a silicon-containing layer. The method includes executing a first etch process that includes forming a first plasma from a first process gas that includes hydrogen bromide or chlorine and etching the underlying layer using products of the first plasma. The method includes executing a second etch process that includes forming a second plasma from a second process gas that includes fluorine and etching the substrate using products from the second plasma. The method may include alternating between the first etch process and the second etch process.

Example 2

The method of example 1, where the etch mask is a dielectric mask.

Example 3

The method of one of examples 1 or 2, where the etch mask is selected from the group consisting of silicon nitride, silicon oxide, silicon-containing anti-reflective coating, and organic material.

Example 4

The method of one of examples 1 to 3, where the underlying layer is silicon or silicon-germanium.

Example 5

The method of one of examples 1 to 4, where the first process gas includes $CF_4$, $C_4F_8$, $C_4F_6$, $CH_3F$, $CHF_3$, or $CH_2F_2$.

Example 6

The method of one of examples 1 to 5, where the second process gas is selected from the group consisting of $CF_4$, $C_4F_8$, $C_4F_6$, $CH_3F$, $CHF_3$, $CH_2F_2$, $NF_3$, and $SF_6$.

Example 7

The method of one of examples 1 to 6, where the first etch process is an anisotropic etch process.

Example 8

The method of one of examples 1 to 7, where the first etch process includes an anisotropic etch process and an isotropic etch process.

Example 9

The method of one of examples 1 to 8, where the second etch process is an anisotropic etch process.

Example 10

The method of one of examples 1 to 9, where alternating between the first etch process and the second etch process continues until a predetermined amount of the underlying layer has been etched.

Example 11

The method of one of examples 1 to 10, where the second etch process includes bromine or chlorine in addition to the fluorine.

Example 12

A method of processing a substrate includes receiving a substrate in a processing chamber, the substrate including a patterned layer disposed over a layer to be patterned, where the layer to be patterned includes silicon. The method includes forming recesses in the layer to be patterned to a first depth with a first plasma etch process using a first process gas including a first halogen element. The method includes extending the recesses to a second depth by using a second plasma etch process using a second process gas including a second halogen element, where the second halogen element is more electronegative than the first halogen element, where the first plasma etch is more selective than the second plasma etch process.

Example 13

The method of example 12, where the first halogen element includes bromine or chlorine, and where the second halogen element includes fluorine.

Example 14

The method of one of examples 12 or 13, further including: performing a breakthrough etch in the processing chamber before performing the first etch process.

Example 15

The method of one of examples 12 to 14, further including: after performing the second plasma etch process, extending the recesses to a third depth with another first plasma etch process using the first process gas including the first halogen element; and after performing the another first plasma etch process, extending the recesses to a fourth depth by using another second plasma etch process using the second process gas including the second halogen element.

Example 16

A method of processing a substrate includes receiving a substrate in a processing chamber, the substrate including a patterned layer disposed over a layer to be patterned, where the layer to be patterned includes silicon. The method includes using the patterned layer as an etch mask, performing a first etch process on the substrate in the processing chamber, where the first etch process forms recesses in the layer to be patterned and byproducts covering top surfaces of the patterned layer. The method includes performing a second etch process on the substrate in the processing chamber, where the second etch process extends the recesses into the layer to be patterned and etches a portion of the byproducts.

Example 17

The method of example 16, where the second etch process removes all of the byproducts.

Example 18

The method of one of examples 16 or 17, where the byproducts include silicon, oxygen, and a halogen.

Example 19

The method of one of examples 16 to 18, where the first etch process includes a first process gas including hydrogen bromide or chlorine, and where the second etch process includes a second process gas including fluorine.

Example 20

The method of one of examples 16 to 19, wherein the first etch process comprises a first process gas comprising fluorine, and wherein the second etch process comprises a second process gas comprising fluorine, wherein an amount of fluorine in the first process gas is less than an amount of fluorine in the second process gas.

Example 21

The method of one of examples 16 to 20, further including: after performing the second etch process, performing another first etch process on the substrate in the processing chamber, where the another first etch process extends the recesses in the layer to be patterned and forms additional byproducts covering top surfaces of the patterned layer; and after performing the another first etch process, performing another second etch process on the substrate in the processing chamber, where the another second etch process extends the recesses further into the layer to be patterned and etches a portion of the additional byproducts.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   executing a first etch process to etch exposed portions of an underlying layer by
      exposing a substrate disposed in a processing chamber to a first plasma through an etch mask, the substrate having the etch mask positioned over the underlying layer to be etched, the underlying layer being a silicon-containing layer, the first plasma being formed from a first process gas that includes hydrogen bromide or chlorine, and
      etching the exposed portions of the underlying layer using products of the first plasma;
   executing a second etch process to further etch further exposed portions of the underlying layer by
      exposing the substrate to a second plasma through the etch mask, the second plasma being formed from a second process gas that includes fluorine, the second process gas being different from the first process gas, and
      etching the further exposed portions of the underlying layer using products of the second plasma; and
   further etching exposed portions of the underlying layer by alternating between the first etch process and the second etch process.

2. The method of claim 1, wherein the etch mask is a dielectric mask.

3. The method of claim 1, wherein the etch mask is selected from the group consisting of silicon nitride, silicon oxide, silicon-containing anti-reflective coating, and organic material.

4. The method of claim 1, wherein the underlying layer is silicon or silicon-germanium.

5. The method of claim 1, wherein the first process gas includes $CF_4$, $C_4F_8$, $C_4F_6$, $CH_3F$, $CHF_3$, or $CH_2F_2$.

6. The method of claim 1, wherein the second process gas is selected from the group consisting of $CF_4$, $C_4F_8$, $C_4F_6$, $CH_3F$, $CHF_3$, $CH_2F_2$, $NF_3$, and $SF_6$.

7. The method of claim 1, wherein alternating between the first etch process and the second etch process continues until a predetermined amount of the underlying layer has been etched.

8. The method of claim 1, wherein the second plasma is formed from the second process gas that includes fluorine and bromine or chlorine.

9. The method of claim 1, further comprising generating the first plasma from the first process gas and oxygen.

10. A method of processing a substrate, the method comprising:
    receiving a substrate in a processing chamber, the substrate comprising a patterned layer disposed over a layer to be patterned, the layer to be patterned comprising silicon;

forming recesses in the layer to be patterned to a first depth with a first plasma etch process using a first process gas comprising a first halogen element; and extending the recesses in the layer to be patterned to a second depth with a second plasma etch process using a second process gas comprising a second halogen element, the second halogen element being more electronegative than the first halogen element, the first plasma etch process being more selective than the second plasma etch process;

after performing the second plasma etch process, extending the recesses to a third depth with another first plasma etch process using the first process gas comprising the first halogen element; and after performing the another first plasma etch process, extending the recesses to a fourth depth by using another second plasma etch process using the second process gas comprising the second halogen element.

11. The method of claim 10, wherein the first halogen element comprises bromine or chlorine, and wherein the second halogen element comprises fluorine.

12. The method of claim 10, wherein the second plasma etch process also etches solid byproducts from the first plasma etch process.

13. A method of processing a substrate, the method comprising:

receiving a substrate in a processing chamber, the substrate comprising a patterned layer disposed over a layer to be patterned, the layer to be patterned comprising silicon;

using the patterned layer as an etch mask, performing a first etch process on the substrate in the processing chamber, wherein the first etch process forms, with a first plasma, recesses in the layer to be patterned and forms byproducts covering top surfaces of the patterned layer; and performing a second etch process on the substrate in the processing chamber, wherein the second etch process extends, with a second plasma, the recesses into the layer to be patterned and etches a portion of the byproducts, the first etch process being more selective than the second etch process.

14. The method of claim 13, wherein the byproducts comprise silicon, oxygen, and a halogen.

15. The method of claim 13, wherein the first etch process comprises a first process gas to form the first plasma, the first process gas comprising hydrogen bromide or chlorine, and wherein the second etch process comprises a second process gas to form the second plasma, the second process gas comprising fluorine.

16. The method of claim 13, wherein the first etch process comprises a first process gas to form the first plasma, the first process gas comprising fluorine, and wherein the second etch process comprises a second process gas to form the second plasma, the second process gas comprising fluorine, wherein an amount of fluorine in the first process gas is less than an amount of fluorine in the second process gas.

17. The method of claim 13, further comprising:

after performing the second etch process, performing another first etch process on the substrate in the processing chamber, wherein the another first etch process extends the recesses in the layer to be patterned and forms additional byproducts covering top surfaces of the patterned layer; and after performing the another first etch process, performing another second etch process on the substrate in the processing chamber, wherein the another second etch process extends the recesses further into the layer to be patterned and etches a portion of the additional byproducts.

18. The method of claim 13, wherein the first etch process comprises a first process gas comprising hydrogen bromide or chlorine, and wherein the second etch process comprises hydrogen bromide or chlorine and a second process gas comprising fluorine.

19. The method of claim 18, further comprising:

generating the first plasma for the first etch process from the first process gas and oxygen; and generating the second plasma for the second etch process from hydrogen bromide or chlorine and the second process gas.

20. The method of claim 13, further comprising leaving a remaining portion of the byproducts covering the top surfaces of the patterned layer after the second etch process.

* * * * *